United States Patent [19]

Theobald

[11] Patent Number: 5,463,562
[45] Date of Patent: Oct. 31, 1995

[54] DESIGN AUTOMATION METHOD FOR DIGITAL ELECTRONIC CIRCUITS

[75] Inventor: Leonard Theobald, Manchester, Great Britain

[73] Assignee: International Computers Limited, London, Great Britain

[21] Appl. No.: 359,519

[22] Filed: Dec. 20, 1994

[30] Foreign Application Priority Data

Mar. 3, 1994 [GB] United Kingdom ............... 9404078

[51] Int. Cl.$^6$ .................. H01L 25/00; G01R 15/12; H04B 17/00; G05B 23/02
[52] U.S. Cl. ................. 364/489; 364/488; 364/490; 364/578; 364/176; 364/491; 395/500; 371/22.6; 371/22.5; 371/22.3; 371/22.1
[58] Field of Search ............... 364/488, 489, 364/490, 491, 176, 578; 395/500; 371/22.6, 22.5, 22.1, 22.2, 22.3

[56] References Cited

U.S. PATENT DOCUMENTS

| | | | |
|---|---|---|---|
| 4,577,276 | 3/1986 | Dunlop et al. | 364/488 |
| 4,811,237 | 3/1989 | Putatunda et al. | 364/489 |
| 4,815,003 | 3/1989 | Putatunda et al. | 364/489 |
| 4,908,772 | 3/1990 | Chi | 364/489 |
| 4,918,614 | 4/1990 | Modarres et al. | 364/489 |
| 4,922,432 | 5/1990 | Kobayashi et al. | 364/489 |
| 5,187,671 | 2/1993 | Cobb | 364/489 |
| 5,189,628 | 2/1993 | Olsen et al. | 364/489 |
| 5,202,840 | 4/1993 | Wong | 364/489 |

OTHER PUBLICATIONS

Automatic Partitioning for deterministic Test Jan. 1992 IEEE Crestani et al.
VLSI Design Synthesis with testability Jan. 1988 IEEE Gebotys et al.

*Primary Examiner*—Kevin J. Teska
*Assistant Examiner*—Jacques H. Louis-Jacques
*Attorney, Agent, or Firm*—Lee, Mann, Smith, McWilliams, Sweeney & Ohlson

[57] ABSTRACT

A design automation method for digital electronic circuits, including the steps of synthesizing a circuit including at least one logic tree, and then automatically partitioning the logic tree. The automatic partitioning process involves first identifying a set of driving bits for each of a set of points within the tree, ie the tree inputs that affect each of those points. Then, for each of those points, the partitioning process identifies a set of splittable input bits that can be isolated by insertion of a fence register at that point, and identifies which of those points are possible fence points, having more than one splittable input bit. Finally, the partitioning process selects a sub-set of the possible fence points, sufficient to reduce the number of inputs to the logic tree to a value less than a predetermined limit, and inserts fence registers at those points. In this way, the number of inputs to the logic tree can be made small enough (e.g. 17 or less) to allow exhaustive testing of the circuit.

7 Claims, 6 Drawing Sheets

DESIGN AUTOMATION METHOD FOR DIGITAL ELECTRONIC CIRCUITS

BACKGROUND TO THE INVENTION

This invention relates to design automation methods for designing digital electronic circuits. The invention is particularly concerned with electronic circuits, such as very large scale integrated (VLSI) circuits, having built-in self-test (BIST) facilities.

Referring to FIG. 1, this shows a typical digital electronic circuit with BIST facilities. The circuit consists of a number of blocks of logic (logic A–C) interconnected by a number of self-test registers (register 1–5). Each of these self-test registers is designed to have at least the following modes of operation:

(a) User—in this mode the self-test register acts as a conventional parallel input/output latch.

(b) Random—in this mode, the self-test register operates as a linear feedback shift register (LFSR) for generating a pseudo-random sequence of test patterns.

(c) Signature—in this mode, the self-test register operates as an LFSR for receiving a sequence of input data, and generating a digital signature, characteristic of the input data sequence.

(d) Shift—in this mode the self-test register acts as a serial shift register, allowing test patterns to be shifted into the register, and allowing signatures to be shifted out.

The use of such test registers for BIST is described, for example in European Patent No. 0196171 (U.S. Pat. No. 4,701,916). [C1005]

In normal operation, each of these self-test registers is set into its user mode, so that they all act as conventional latches. In order to test logic block A, for example, register 1 is set into the random mode so as to generate a pseudo-random sequence of test patterns at the inputs of logic block A. At the same time, register 3 is set into the signature mode, so as to collect a series of outputs from logic block A, and to form a digital signature. When the test sequence is completed, the registers are all switched to the shift mode, to allow the test results to be serially shifted out over a serial path, and the generated signature is then compared with an expected signature value. If these values are not equal, a fault is indicated.

Referring to FIG. 2, this shows a typical logic block. The logic block consists of a number of logic cells (such as AND gates, NAND gates, OR gates, and so on), represented schematically as rectangles in the drawing, connected together in a network, between a number of inputs (I1–I26) and a number of outputs (O1–O3).

It can be seen from this Figure that it is possible to trace a tree back from each of the outputs, to find the set of inputs that influence that output. In this example, output O1 is influenced by inputs I1–I20, output O2 is influenced by inputs I15–I22, and output O3 is influenced by inputs I23–I26.

In order to test a logic block thoroughly, it is desirable to apply an exhaustive sequence of data patterns to the inputs of each such tree, so as to test the response of the logic to all possible input patterns. However, a problem with this is that if a tree is too large (i.e. has too many inputs), exhaustive testing will take an excessively long time. It has been found in practice that the maximum feasible number of inputs to any given tree for exhaustive testing is about 17. In FIG. 2, for example, the tree traced back from output O1 has 20 inputs, and so, on this criterion, it would not be economically feasible to exhaustively test this tree. On the other hand, the tree traced from output O2 has only 8 inputs, and so exhaustive testing would be feasible.

One way of overcoming this problem is to partition the logic block, by inserting additional self-test registers, referred to herein as fences, in such a manner that each fence bit splits off two or more input bits of a tree, i.e. isolates those input bits from the output of the tree. By inserting a sufficient number of fences in suitable locations, the tree can be reduced to an acceptable size. For example, in FIG. 2, the logic block could be partitioned by inserting a fence at the position indicated by *, so as to divide the tree into two independently testable sub-trees. It can be seen that the fence replaces the five inputs I1–I5 in the large tree with a single input, and so reduces the number of inputs that influence output O1 to 16.

However, the problem still remains of where to position the fences, and how many fences are required, and this can be very difficult and time consuming. The problem is particularly acute where the logic has been generated automatically, by a logic synthesis program, since in that case it is quite likely that the synthesized logic will contain many large trees, and the logic designer will not be familiar with the generated logic.

The object of the present invention is to provide a way of alleviating this problem.

SUMMARY OF THE INVENTION

According to the invention there is provided a method of automatically partitioning a logic tree, comprising the steps:

(a) identifying a set of driving bits for each of a set of points within the tree;

(b) for each of said set of points, identifying a set of splittable input bits that can be isolated by insertion of a fence register at that point;

(c) identifying which of said points are possible fence points, having more than one splittable input bit; and (d) selecting a sub-set of said possible fence points, sufficient to reduce the number of inputs to the logic tree to a value less than a predetermined limit, and inserting fence registers at those points.

DESCRIPTION OF AN EMBODIMENT OF THE INVENTION

One embodiment of the invention will now be described by way of example with reference to FIGS. 3 to 5 of the accompanying drawings.

Figure 1:
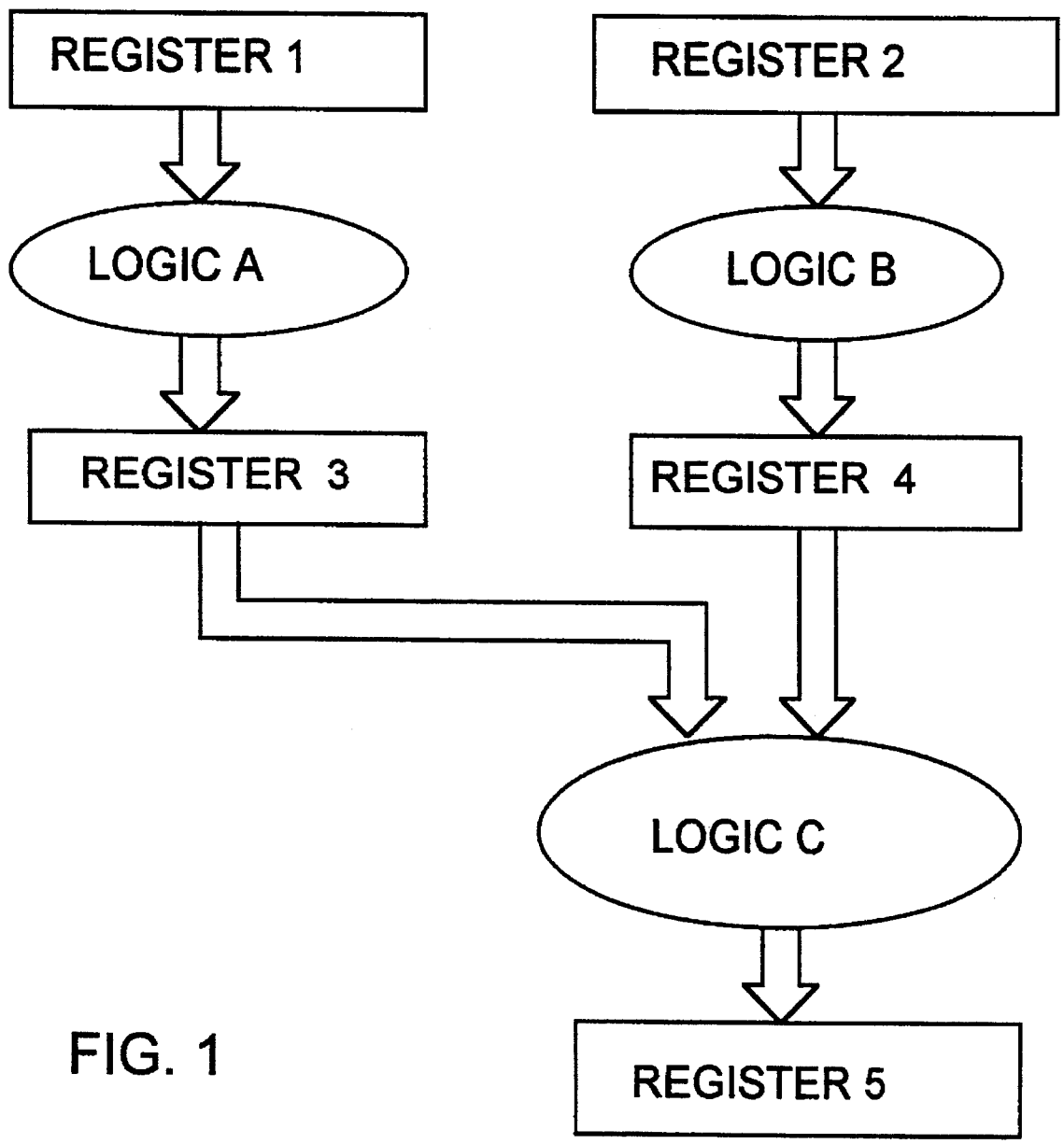
FIG. 1 is a schematic block diagram of a digital electronic circuit.
Figure 2:
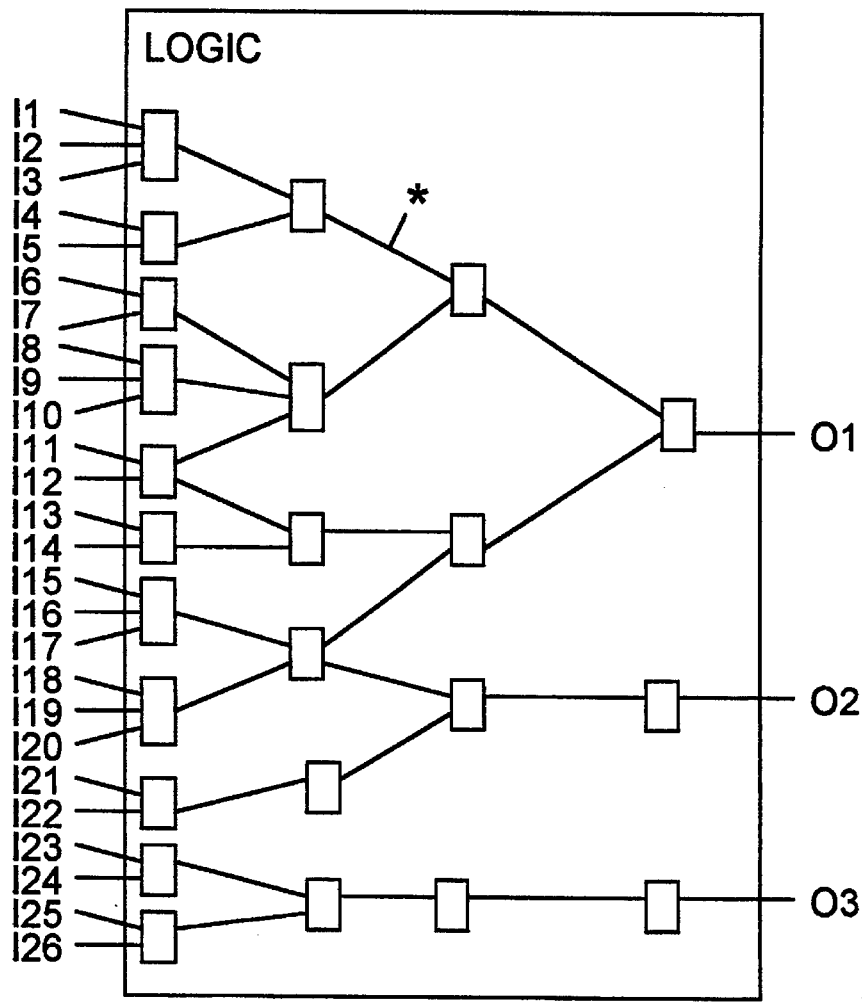
FIG. 2 is a schematic block diagram of a logic block forming part of the circuit.
Figure 3:
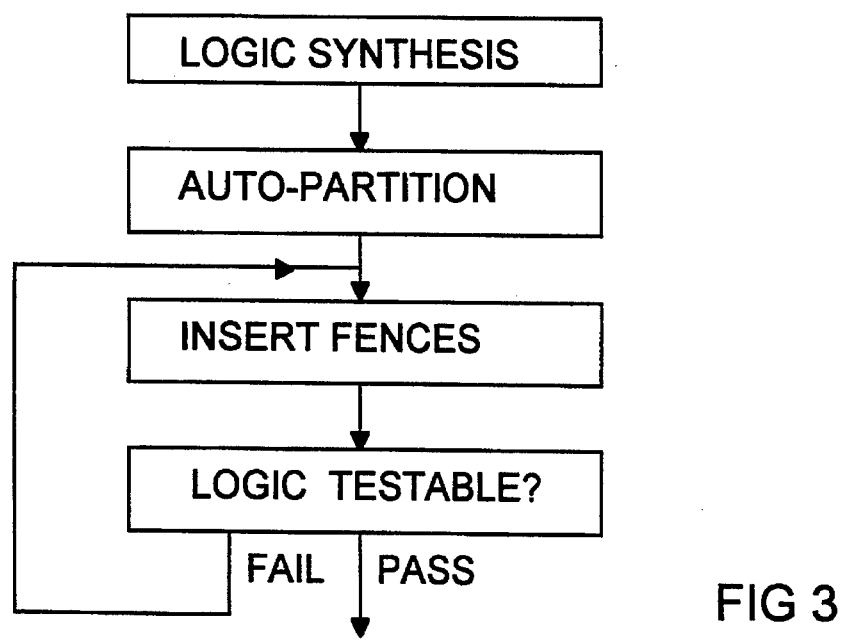
FIG. 3 is a flow chart showing the main components of a design automation process embodying the present invention.

Referring to FIG. 3, this shows a design automation method for designing a digital electronic circuit.

The circuit is first synthesized, using a logic synthesis program. This generates a number of logic blocks. The logic synthesis program may be a conventional, known design automation program, and so will not be described in any further detail.

Each logic block is then processed by an auto-partitioning program, which partitions each block, as necessary, so that the maximum tree size in each block is equal to or less than the limit for exhaustive testing. The auto-partitioning program identifies the positions in which fences are to be inserted into the circuit to achieve this partitioning. The auto-partitioning program is described in more detail below.

Next, the fences specified by the auto-partitioning program are inserted into the design. This may be done automatically, or manually.

The logic design is then checked, to ensure that it is testable. If this check is successful, then the design process is complete. If, on the other hand, the check is not successful, the positions of the fences are adjusted, and the check is repeated.

Auto-Partitioning

Figure 4:
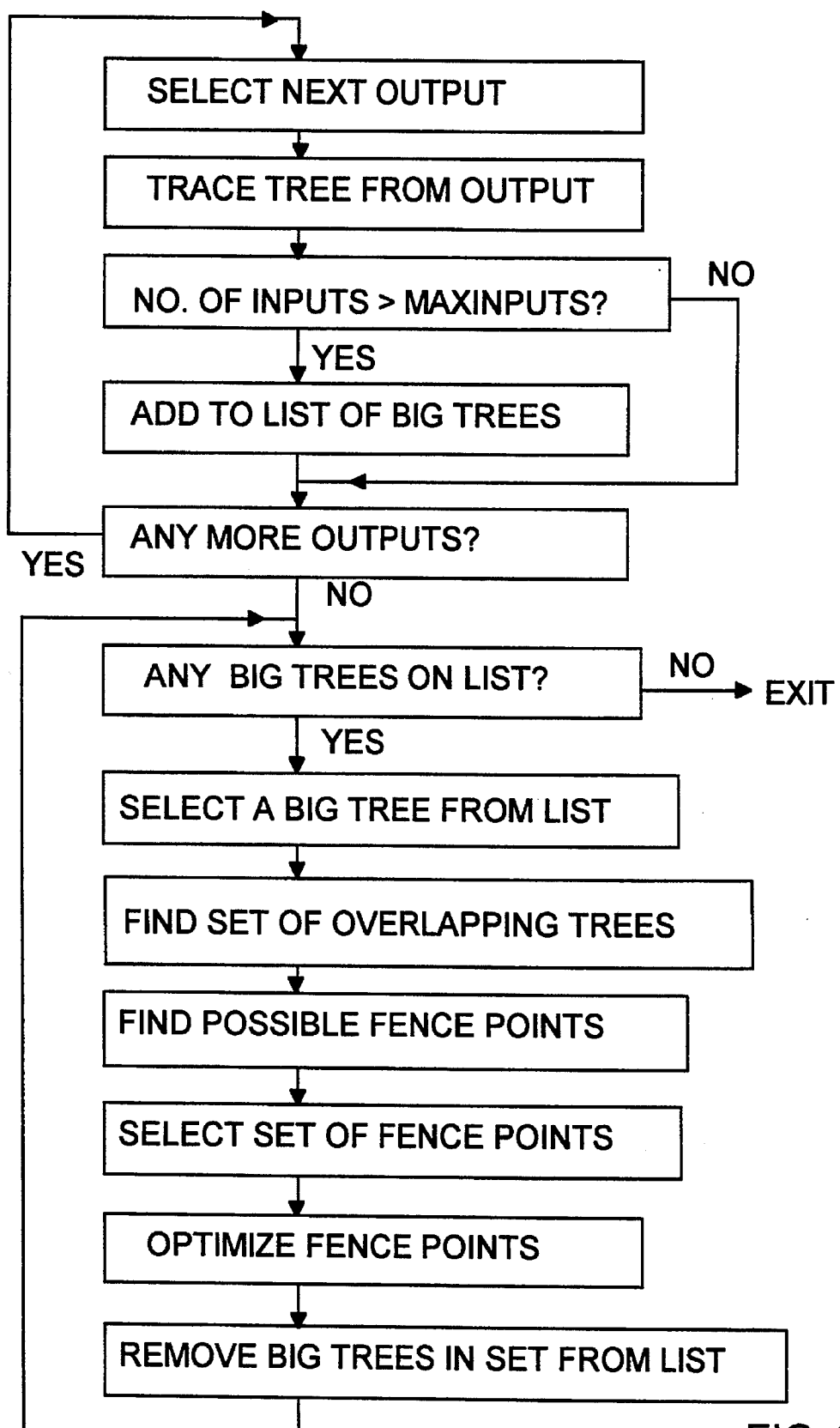
FIG. 4 is a flowchart showing an auto-partition program.

FIG. 4 shows the auto-partitioning program in more detail, showing the actions performed in processing a selected logic block.

The program selects each output of the logic block in turn, and traces the tree back from this output, so as to find the inputs to that tree i.e. the inputs that influence this output. The number of inputs to the tree is compared with a predetermined value MAXINPUTS, equal to the maximum number of inputs that can be exhaustively tested. Typically, MAXINPUTS may be equal to 17. If the number of inputs to a tree is greater than MAXINPUTS, the tree is labelled as a "big" tree, and added to a list of big trees maintained by the auto-partitioning program.

When all the outputs have been processed in this way, the list of big trees is examined. If the list is empty, there are no trees with more than the maximum permitted number of inputs, and so no partitioning is needed. If, on the other hand, there is at least one big tree on the list, the program proceeds as follows.

First, one big tree is selected, and any other trees that overlap this tree are identified and added to a current set of trees. If any of these other trees are also big trees, any trees overlapping them are also identified and added to the current set. This process is repeated recursively until no more big trees can be found that overlap any big trees in the current set.

Figure 5:
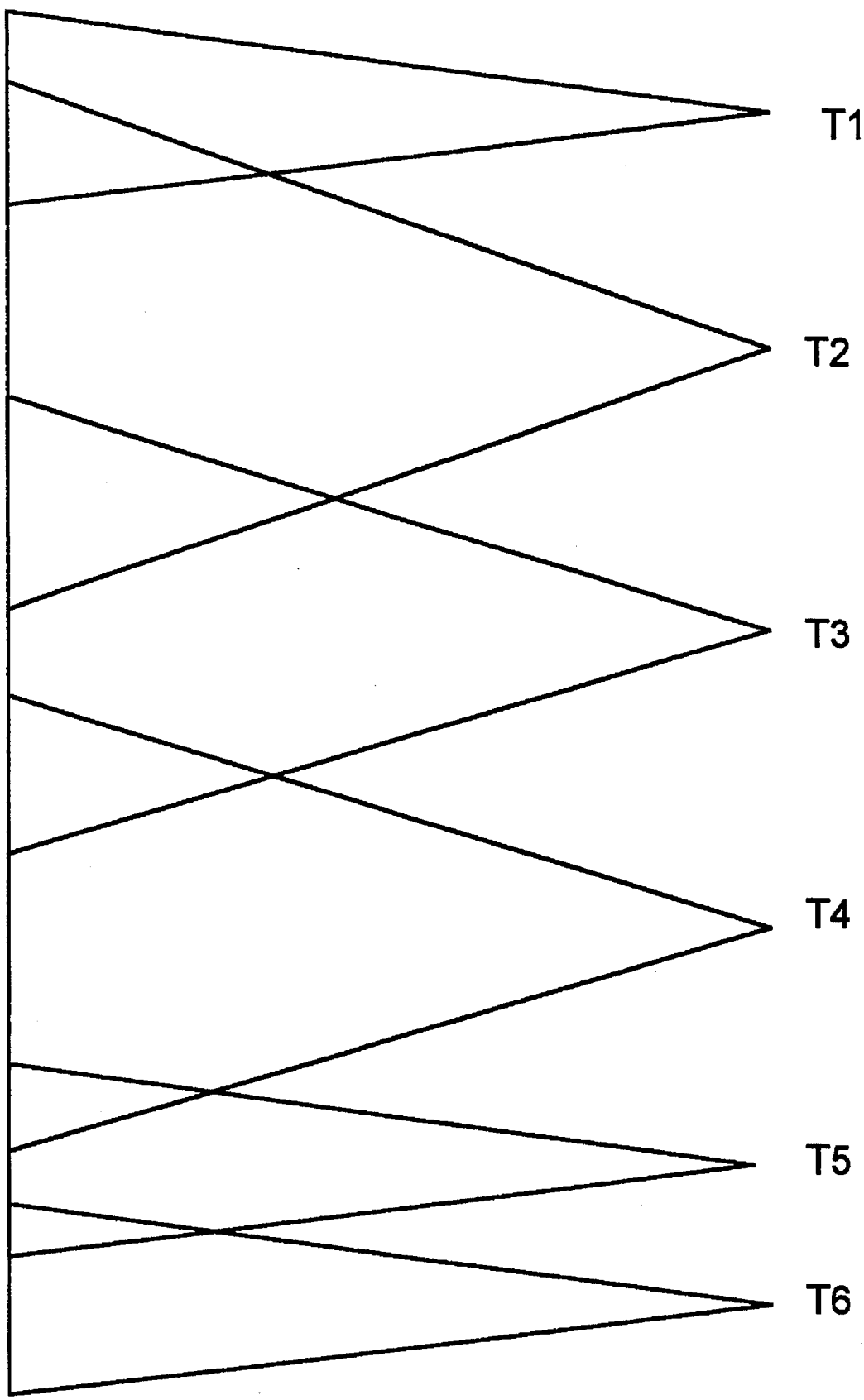
FIG. 5 is a schematic diagram showing the way in which logic trees are selected by the auto-partition program.

As an example, consider the logic block shown schematically in FIG. 5. This logic block comprises trees T1–T5, of which T2–T4 are big trees, and T1,T5 and T6 are small trees.

Suppose that tree T4 is initially selected and added to the current set. The program then adds trees T3 and T5 to the set, since they overlap big tree T4. Then, tree T2 is added to the set, since it overlaps big tree T3. Similarly, tree T1 is added to the set, since it overlaps big tree T2. However, tree T6 is not added to the set, since it overlaps only a small tree (T5) in the set.

The program then processes the current set of trees, so as to identify possible fence points, i.e. points at which fences may be positioned. Only points within the big trees of the set are considered as possible fence points. A point is identified as a possible fence point if it reduces the number of inputs to that tree, i.e. allows two or more bits of input to that tree to be replaced by a single fence bit at that point. If a point lies within the overlapping parts of the trees, all the trees at that point must be treated as a single entity; such a point is identified as a possible fence point only if it reduces the number of inputs to least one of the overlapping trees and does not increase the number of inputs to any of those trees. If this is not done, it is possible that a fence might be inserted which, while reducing the number of inputs to one tree, increases the number of inputs to another, overlapping tree. The way in which possible fence points are identified is described in more detail below.

When the possible fence points have been identified, the next step is to select a subset of these possible fence points. Fence points are selected one at a time, in a predetermined order, starting from the lowest level of the tree (i.e. the points nearest the inputs), until sufficient fence points have been selected to ensure that no tree in the set has more than the permitted maximum number of inputs. Preference may be given to selecting fence points in the overlapping portions of two or more large trees, since this helps to keep the number of fences to a minimum.

An optimization process is then performed, to optimize the positioning of the fence points. This process reduces the number of fence points, where possible, by replacing two or more fence points at a lower level of the tree by a fence point at a higher level. This is possible if the fence at the higher level would isolate all the input bits isolated by the fences at the lower level, and if the tree below the higher fence point contains fewer than the permitted maximum number of inputs MAXINPUTS.

All the big trees in the current set are then removed from the list of big trees. The process described above is repeated until there are no more big trees left on the list, whereupon the auto-partitioning program terminates.

Identification of Possible Fence Points

Figure 6:
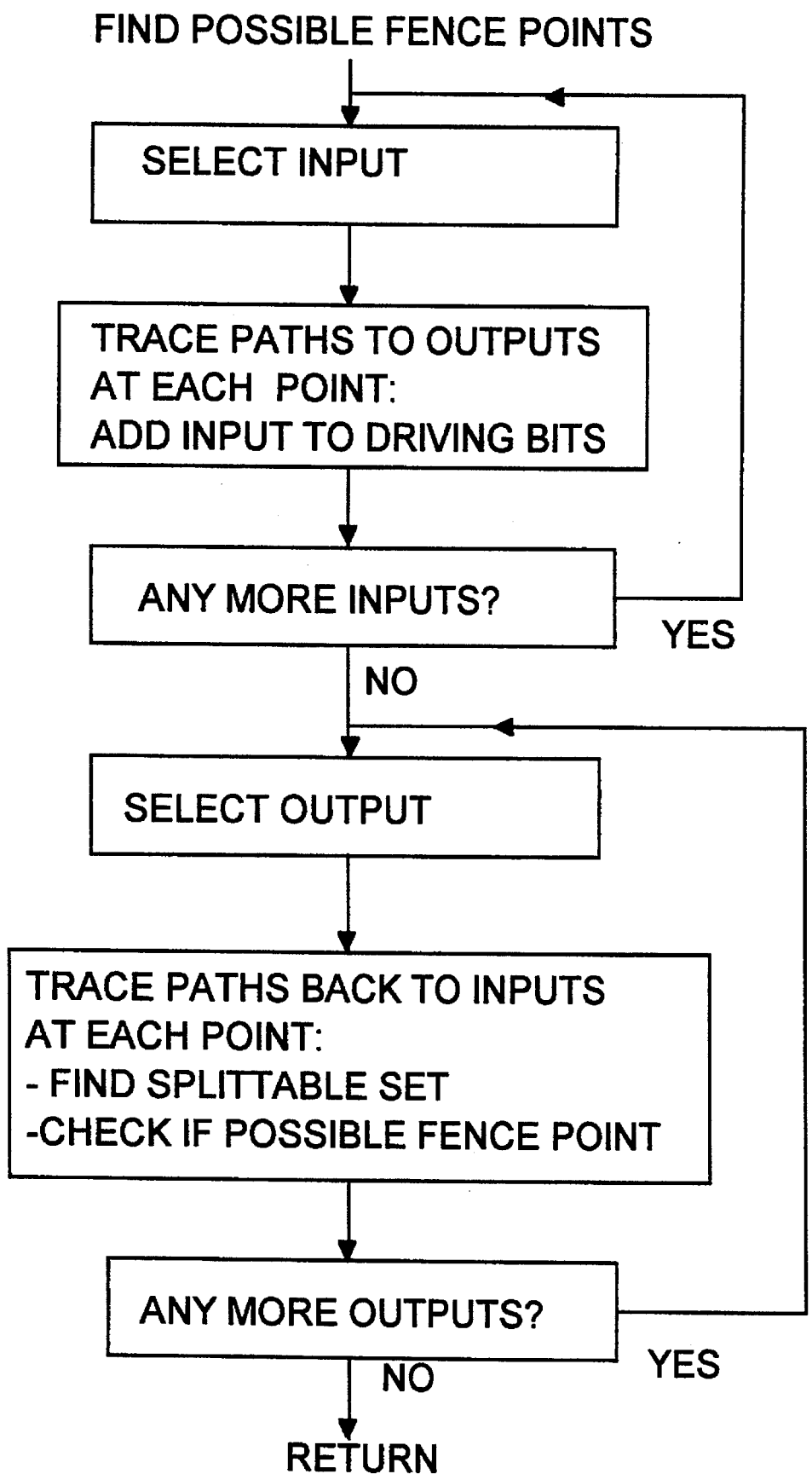
FIG. 6 is a flowchart showing a part of the auto-partition program, for finding possible fence points.

FIG. 6 shows the way in which the auto-partition program identifies possible fence points within a tree (or set of overlapping trees).

The program selects each input of the tree in turn, and traces each path through the tree from that input, adding the identity of the input to a driving bits list at each point of the tree. This constructs a driving bits list at each point, containing a list of all the tree inputs that affect that point.

Figure 7:
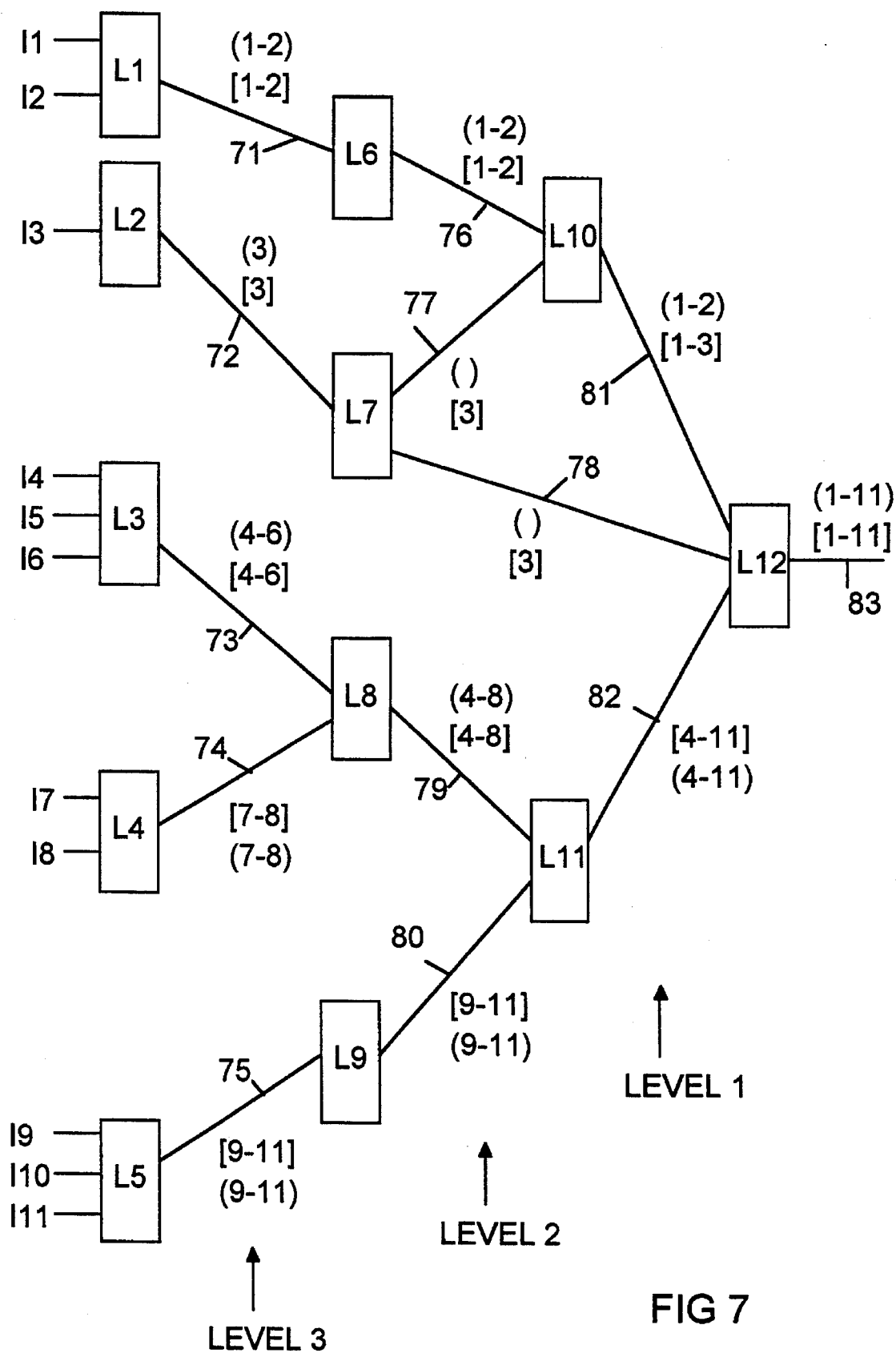
FIG. 7 is a schematic diagram of a logic tree, illustrating the way in which the auto-partition program finds possible fence points.

As an example, FIG. 7 shows a typical logic tree consisting of logic cells L1–L12, and having inputs I1–I11. In this figure, the driving bits list at each point 71–83 is indicated by numbers in square brackets. For example, the driving bits list at point 79 is [4–8], indicating that this point is affected by inputs I4 to I8.

The program then selects each output of the tree in turn, and traces paths from that output back through the tree to the inputs. At each point in the tree, the program finds which input bits can be split at this point, and adds them to a splittable bits list for that point, containing a list of the tree input bits that can be isolated by insertion of a fence at this point. In FIG. 7, the splittable bits list for each point is indicated by numbers in round brackets. For example, the splittable bits list for point 81 is (1–2), indicating that input bits I1 and I2 can be isolated by a fence at this point.

The program uses two alternative methods to determine the splittable bits: branch point analysis and slice analysis.

In branch point analysis, the splittable bits for each input branch to a logic cell are determined by finding the bits that are common to the splittable bits list of the output branch and the driving bits list for this input branch, and which do not also appear in the driving bits list of any other input branch to the same logic cell. In other words:

splittable bits for input branch
= (splittable bits for output branch
   ^ driving bits for input branch)
− driving bits for all other input branches where ^ represents set intersection (i.e. the bits common to the sets, and − represents set difference.

As an example the splittable bits for point 81 in FIG. 7 are derived as follows:

splittable bits at point 81
= (splittable bits at output of L12)
  ^ [driving bits at point 81]
  − [driving bits at points 78 & 82]
= (1 ... 11) ^ [1,2,3]−[3,4 ... 11]
= [1,2,3]−[3,4 ... 11]
= [1,2]

Note that bit 3 is not in the splittable bits set at this point, because it also appears at the other input branch 78 to the logic cell L12.

Branch point analysis fails when it encounters reconvergent logic, i.e. logic with branches that divide at one logic cell and then merge together again at a subsequent logic cell, such as occurs between logic cells L7 and L12 in FIG. 7. It can be seen that, in this case, branch point analysis would produce an empty splittable bits list at point 72, since the splittable bits lists at the outputs of logic cell L7 are both empty. However, it is clear that input bit I3 is splittable at this point. When branch point analysis fails, slice analysis is used.

For slice analysis, a logical level number is assigned to each point in the tree, starting from the output of the tree. Connections between cells are "stretched" as necessary so as to accommodate levels in parallel branches. For example, in FIG. 7, the connection between logic cells L7 and L12 is "stretched" to accommodate the cell L10 in the parallel branch, so that the point 78 effectively exists at both level 1 and level 2.

In slice analysis, the splittable bits for any point at any level are determined by taking the driving bits for that point and subtracting the driving bits for all other points in a cross-section of the tree at the same logical level. In other words, the splittable bit set is given by:

splittable bits at a point
= driving bits for the point
− driving bits for all other points at same logical level.

Thus, for example, in FIG. 7, the splittable bit set at point 72 is derived as follows:

splittable bits at point 72
= [driving bits at point 72]
  − [driving bits at points 71, 73, 74, 75]
= [3]−[1,2,4 ... 11]
= [3].

Branch point analysis is more efficient than slice analysis, since it only needs to look at the input and output branches of one logic cell, whereas slice analysis needs to examine a cross section of the complete tree. Therefore, when determining the splittable bits list at any point, the program initially uses branch point analysis. If this produces an empty splittable bits list for the point, slice analysis is used.

When the set of splittable bits for a point is known, the program decides whether this point is a possible fence point. A point is considered suitable as a fence point only if the number of splittable bits at that point is greater than one. For example, in FIG. 7, it can be seen that points 71, 73, 74, 75, 76, 79, 80, 81 and 82 are all possible fence points. If a point lies within the overlapping parts of two or more trees, a separate splittable bits list for that point is determined for each tree in which the point lies, and the point is considered suitable as a fence point only if at least one of these splittable bits lists contains more than one bit and the rest of these splittable bits lists each contain at least one bit. The point can then be used to split at least one tree, without a detrimental effect on the other trees.

I claim:

1. A method of automatically partitioning a logic tree to improve testability thereof, comprising the steps:
   (a) identifying a set of driving bits for each of a set of points within the tree;
   (b) for each of said set of points, identifying a set of splittable input bits that can be isolated by insertion of
   (c) identifying which of said points are possible fence points, having more than one splittable input bit; and
   (d) selecting a sub-set of said possible fence points, sufficient to reduce the number of inputs to the logic tree to a value less than a predetermined limit, and inserting self-test registers at said sub-set of possible fence points.

2. A method according to claim 1 wherein the step of identifying the set of splittable bits at a point comprises:
   (a) using a first method involving a local analysis of the driving bits and splittable bits in the vicinity of that point to derive the set of splittable bits for that point; and
   (b) if the first method fails, using a second method involving an analysis of the driving bits in a cross-section of the whole tree.

3. A method according to claim 1 including a further step of optimizing said sub-set of possible fence points, by replacing in said sub-set two or more fence points in one level of the tree with a single fence point at a higher level of the tree.

4. A design automation method for digital electronic circuits, including the steps of synthesizing a circuit design including at least one logic tree, and then automatically partitioning said logic tree to improve testability thereof by means of an automatic partitioning method comprising the steps:
   (a) identifying a set of driving bits for each of a set of points within the tree;

(b) for each of said set of points, identifying a set of splittable input bits that can be isolated by insertion of a self-test register at that point;

(c) identifying which of said points are possible fence points, having more than one splittable input bit; and (d) selecting a sub-set of said possible fence points, sufficient to reduce the number of inputs to the logic tree to a value less than a predetermined limit, and inserting self-test registers at said sub-set of possible fence points.

5. A method according to claim 4 wherein the step of identifying the set of splittable bits at a point comprises:

(a) using a first method involving a local analysis of the driving bits and splittable bits in the vicinity of that point to derive the set of splittable bits for that point; and (b) if the first method fails, using a second method involving an analysis of the driving bits in a cross-section of the whole tree.

6. A method according to claim 4 including a further step of optimizing said sub-set of possible fence points, by replacing in said sub-set two or more fence points in one level of the tree with a single fence point at a higher level of the tree.

7. A computer system, comprising:

(a) means for synthesizing a circuit design including at least one logic tree;

(b) means for identifying a set of driving bits for each of a set of points within the tree;

(c) means for identifying, for each of said set of points, a set of splittable input bits that can be isolated by insertion of a self-test register at that point;

(d) means for identifying which of said points are possible fence points, having more than one splittable input bit;

(e) means for selecting a sub-set of said possible fence points, sufficient to reduce the number of inputs to the logic tree to a value less than a predetermined limit; and (f) means for inserting self-test registers at said sub-set of possible fence points to improve testability of said logic tree.

* * * * *